(12) United States Patent
Camp

(10) Patent No.: US 10,957,482 B2
(45) Date of Patent: Mar. 23, 2021

(54) MANUFACTURING PROCESS FOR GRADIENT COIL SUB-ASSEMBLIES

(71) Applicant: Tesla Engineering Limited, Sussex (GB)

(72) Inventor: Allen Raymond Camp, West Sussex (GB)

(73) Assignee: TESLA ENGINEERING LIMITED, Sussex (GB)

( * ) Notice: Subject to any disclaimer, the term of this patent is extended or adjusted under 35 U.S.C. 154(b) by 279 days.

(21) Appl. No.: 16/029,332

(22) Filed: Jul. 6, 2018

(65) Prior Publication Data

US 2018/0313914 A1    Nov. 1, 2018

Related U.S. Application Data

(60) Division of application No. 14/162,334, filed on Jan. 23, 2014, now Pat. No. 10,031,194, which is a
(Continued)

(30) Foreign Application Priority Data

Sep. 22, 2010    (GB) ..................................... 1015967

(51) Int. Cl.
*H01F 41/02* (2006.01)
*G01R 33/385* (2006.01)
(Continued)

(52) U.S. Cl.
CPC ....... *H01F 41/0233* (2013.01); *G01R 33/341* (2013.01); *G01R 33/34007* (2013.01);
(Continued)

(58) Field of Classification Search
CPC ............ H01F 41/0213; H01F 41/0233; H01F 2041/0711; H01F 2017/046;
(Continued)

(56) References Cited

U.S. PATENT DOCUMENTS

| | | | |
|---|---|---|---|
| 4,578,654 A | * | 3/1986 | Tait .................. G06K 19/07779 333/167 |
| 5,289,129 A | * | 2/1994 | Joseph ................. G01R 33/385 324/318 |

(Continued)

FOREIGN PATENT DOCUMENTS

JP        2004342755 A  * 12/2004   ........... H01F 41/041

*Primary Examiner* — A. Dexter Tugbang
(74) *Attorney, Agent, or Firm* — McCormick, Paulding & Huber PLLC

(57) ABSTRACT

An MRIS gradient coil sub-assembly comprising a first coil layer comprising a first conducting coil portion, a second coil layer comprising a second conductive coil portion electrically connected with the first conductive coil portion so that the first and second conductive coil portions act together as one coil, and a B-stage material consolidation layer sandwiched between the first and second coil layers. A method including laminating a first punched sheet metal conductive saddle coil portion and a second punched sheet metal conductive saddle coil portion together by bonding the first and second punched sheet metal conductive saddle coil portions on opposing sides of a B-stage material insulation layer, and electrically connecting the first punched sheet metal conductive saddle coil portion to the second punched sheet metal conductive saddle coil portion in parallel so that the first and second conductive saddle coil portions act together as one saddle coil.

6 Claims, 4 Drawing Sheets

Related U.S. Application Data continuation of application No. 13/234,522, filed on Sep. 16, 2011, now Pat. No. 8,674,692.

(51) Int. Cl.
  *G01R 33/34*     (2006.01)
  *G01R 33/341*    (2006.01)
  *H01F 17/04*     (2006.01)
  *H01F 41/071*    (2016.01)

(52) U.S. Cl.
  CPC ..... *G01R 33/3858* (2013.01); *H01F 41/0213* (2013.01); *H01F 2017/046* (2013.01); *H01F 2041/0711* (2016.01); *Y10T 29/4902* (2015.01)

(58) Field of Classification Search
  CPC .......... Y10T 29/4902; G01R 33/34007; G01R 33/341; G01R 33/385; G01R 33/3858; G06K 19/07779
  See application file for complete search history.

(56) References Cited

U.S. PATENT DOCUMENTS

| | | | | |
|---|---|---|---|---|
| 5,349,744 A | * | 9/1994 | Takahashi | G01R 33/3858 29/602.1 |
| 6,996,892 B1 | * | 2/2006 | Dening | Y10T 29/4902 29/602.1 |
| 2004/0239467 A1 | * | 12/2004 | Liu | F20L 7/046 336/200 |

* cited by examiner

MANUFACTURING PROCESS FOR GRADIENT COIL SUB-ASSEMBLIES

CROSS-REFERENCE TO RELATED APPLICATIONS

The present application is a divisional patent application which claims priority to 35 U.S.C. § 120 to U.S. patent application Ser. No. 14/162,334 filed Jan. 23, 2014 which is a continuation application claiming priority under 35 U.S.C. § 120 to U.S. application Ser. No. 13/234,522, filed Sep. 16, 2011, entitled "Gradient Coil Sub-Assemblies," which is incorporated here by reference in its entirety. Application Ser. No. 13/234,522 claimed the benefit under 35 U.S.C. § 119(a)-(d) of United Kingdom patent application No. 1015967.1 filed Sep. 22, 2010. This application is also herein incorporated by reference in its entirety.

This invention relates to gradient coil sub-assemblies and assemblies for use in magnetic resonance imaging and spectroscopy (MRIS).

Typically, an MRI machine will include at least three independent electrical windings, each one typically used to encode one Cartesian dimension (X, Y and Z). Thus, typically there will be X, Y and Z coils in a gradient coil assembly of an MRI machine.

Typically a gradient coil assembly will be made up from a number of sub-assemblies. Thus there may be one or more X coil sub-assembly (some of which can be referred to as saddles), and so on.

The windings in the sub-assemblies may carry up to several hundred amperes and are typically energised and de-energised over periods as short as 100 microseconds. Large voltages (typically up to 2 kV) must be applied to the windings to achieve such switching. The voltages are applied over a few microseconds. Separate windings are energised and de-energised independently, but on occasions more than one winding may be energised or de-energised simultaneously. Such instances increase yet further the potential differences present in the coil structure.

Gradient coil assemblies and sub-assemblies are typically impregnated with epoxy resins after assembly to ensure good electrical and mechanical integrity. It is a known property of such resin systems that above a certain potential difference threshold, a phenomenon known as "partial discharge" occurs in regions of high electrical stress. This phenomenon is the result of microscopic charge redistribution around the inner surfaces of voids in the dielectric. Such discharges create broadband electrical interference that is deleterious to the sensitive radio frequency detection systems used in MRIS.

It is generally agreed that partial discharge inception voltage (PDIV) occurs at lower voltage levels if there are either bubbles of air (or voids) in the insulation system or there are any sharp points present on the metal coil portions making up the windings in the gradient coil assembly.

The X, Y and Z coils that make up a typical gradient coil may be manufactured from plates of copper or another suitable metal having cut patterns to form current paths, or they may be wound either from solid or hollow metal conductors. Once the paths are formed, the resulting coil is mechanically consolidated so that it can be handled without the metal turns unraveling or changing shape in an uncontrolled way. The coils are often consolidated and held in place by some kind of non-conducting backing/substrate.

In one method, a coil has its patterns formed and then to consolidate the coil turns, a composite backing is bonded to the coil using epoxy or some other resin and a hot press. Once consolidated, the coil may be formed into a non-planar shape as required without the current paths moving in an undesirable way. Once the gradient coils have been formed, they are assembled into a gradient coil assembly. The whole assembly is usually vacuum impregnated with an epoxy or some other resin and then cured for a period of time to consolidate the entire assembly.

Epoxy resins, glass cloths, and other insulating materials generally have high dielectric strengths and relatively high relative dielectric constants between about 2 and 6. In the absence of defects, they can withstand the voltage levels typically employed in MRIS. However, if there are voids in the insulation, the large difference in relative dielectric constants between the material and the void causes enhancement of electric field in the void, and the PDIV may be relatively low [eg 1 kV].

Two major causes of low PDIV are air bubbles (or voids) and sharp points or burrs on the metal coils. Where there are air bubbles (or voids), the electric field in the air bubble (or void) may be much higher than in the material surrounding the air bubble (or void).

Electrical discharge occurs in air at a field strength of about 3 kV/mm. This type of field strength can occur in an air bubble in the gradient coil assembly in an MRIS machine.

Sharp points also cause regions of intense electric field which increase the likelihood of partial discharge (either on their own or in proximity to air bubbles (or voids)).

As mentioned earlier, to build gradient coil assemblies it is usual to consolidate individual coils/windings to form sub-assemblies and to build those coils into a complete coil assembly. Thus it is likely that the coils will be backed by partially cured epoxy resin impregnated materials (known as B-stage materials). B-stage materials have air pockets (or voids) in them that cannot, in practical terms, be completely eliminated.

Further, the windings in the coils will have sharp points on them. It is not reasonable to expect to machine and consolidate coils and have no bubbles (or voids) or burrs left at the end of the process.

However, in a region where B-stage material is absent it can be reasonable to expect that a vacuum impregnation process can yield a void free region.

Thus, it has been realised that if it is possible to construct a gradient coil sub-assembly and assembly where B-stage materials and burrs are restricted to regions of low electric field strength, it should be possible to construct gradient coil sub-assemblies and assemblies having higher PDIV.

According to one aspect of the present invention there is provided an MRIS gradient coil sub-assembly comprising, a first coil layer comprising a first conductive coil portion, a second coil layer comprising a second conductive coil portion electrically connected with the first conductive coil portion so that the first and second conductive coil portions act together as one winding, and an insulation layer sandwiched between the first and second coil layers.

This arrangement can lead to low or relatively low electric field in the insulation layer between the conductive coil portions which can help minimise partial discharge during use of the ultimate gradient coil.

The insulation layer may comprise a consolidation layer. The insulation layer may comprise B-stage material.

The first and second conductive coil portions may be bonded on respective sides of the insulation layer.

The insulation layer may comprise a plurality of sub-layers but preferably the insulation layer comprises a sheet of insulating material with the first and second conductive coil portions being bonded on respective sides of the sheet of insulating material.

This can allow both coil portions to be consolidated using one consolidation layer. Further, this consolidation layer will then tend to experience low or relatively low electric field in use of the ultimate gradient coil.

The first conductive coil portion may be connected in parallel with the second conductive coil portion. The first conductive coil portion may be connected in series with the second conductive coil portion.

The first and second conductive coil portions may be of sheet metal.

The conductive coil portions may be sheet like and each have one surface which has a higher incidence of burrs than the respective opposing surface and the first and second conductive coil portions may be arranged so that the surfaces with the higher incidence of burrs face one another and hence face the insulation layer sandwiched between the first and second coil layers.

Where the coil portions are manufactured from sheet metal, the process used to form the coil pattern, which might be for example, cutting, milling, or punching, can have a tendency to leave burrs on the cut edges—often the process will tend to be such that one side of the sheet is more prone to burrs. The above arrangement helps minimise partial discharge in the final coil in such circumstances.

The first and second conductive coil portions may be identical to one another. The first and second conductive coil portions may be similar to one another.

A coil pattern of the first conductive coil portion may be identical to a coil pattern of the second conductive coil portion when both are viewed from the side facing the insulation layer sandwiched between the first and second coil layers. A coil pattern of the first conductive coil portion may be a mirror image of a coil pattern of the second conductive coil portion when both coil portions are viewed from the side facing the insulation layer sandwiched between the first and second coil layers.

Where the coil portions are manufactured from sheet metal, a coil pattern of the first conductive coil portion may be a mirror image of a coil pattern of the second conductive coil portion when both coil portions are viewed from the side of the sheet metal from which the process to form the coil pattern has been conducted.

Where the coil portions are manufactured from sheet metal, a coil pattern of the first conductive coil portion may be the same as a coil pattern of the second conductive coil portion when both coil portions are viewed from the side of the sheet metal from which the process to form the coil pattern has been conducted.

Gaps may be left in the insulating layer to facilitate electrical connection between the coil portions. Electrical connection may be effected by soldering.

According to another aspect of the present invention there is provided a method of manufacturing a gradient coil sub-assembly comprising a first coil layer comprising a first conductive coil portion, a second coil layer comprising a second conductive coil portion electrically connected with the first conductive coil portion so that the first and second conductive coil portions act together as one winding, and an insulation layer sandwiched between the first and second coil layers, the method comprising the steps of:

a) laminating the first and second conductive coil portions together by bonding the first and second conductive coil portions on opposing sides of the insulation layer; and b) electrically connecting the first conductive coil portion to the second conductive coil portion.

The method may comprise, before step a) the further step of processing metal sheet to form the first conductive coil portion and the second conductive coil portion with desired coil patterns.

A plurality of bridges may be left initially between turns in the coil patterns to provide support during manufacture. In such a case the bridges may then be removed after step a). This may be before or after step b).

Preferably the bridges left initially in the first and second conductive coil portions are not in register with one another.

The method may comprise the step of arranging the first and second coil portions so that respective surfaces of each coil portion having a higher incidence of burrs than the respective opposing surfaces, face one another and hence face the insulation layer sandwiched between the first and second coil layers.

The bridges are preferably removed from the respective side of the sub-assembly and preferably removed in a way so that any burrs that are created will tend to be created on or towards the side of the coil portion facing the insulation layer.

Where the coil portions are manufactured from sheet metal, the method may comprise the further step of performing the process to form the coil pattern from one side of the sheet and choosing the coil pattern of the first conductive coil portion to be a mirror image of the coil pattern of the second conductive coil portion when both are viewed from the side of the sheet metal from which the process is performed.

According to another aspect of the present invention there is provided an MRIS gradient coil assembly comprising at least one sub-assembly as defined above.

According to another aspect of the present invention there is provided an MRI machine comprising at least one sub-assembly as defined above.

Embodiments of the present invention will now be described, by way of example only, with reference to the accompanying drawings in which:

FIG. 1 schematically shows an MRI machine;

FIG. 2 schematically shows part of a conventional gradient coil assembly for use in an MRI machine of the type shown in FIG. 1;

FIG. 3 schematically shows part of a gradient coil assembly embodying the present invention which is also suitable for use in an MRI machine of the type shown in FIG. 1;

The inner set of drive coils 2A comprises windings making up an X drive coil, a Y drive coil and a Z drive coil, and similarly the outer shield coils 2B comprises windings making up an X shield coil, a Y shield coil and a Z shield coil.

Figure 2:
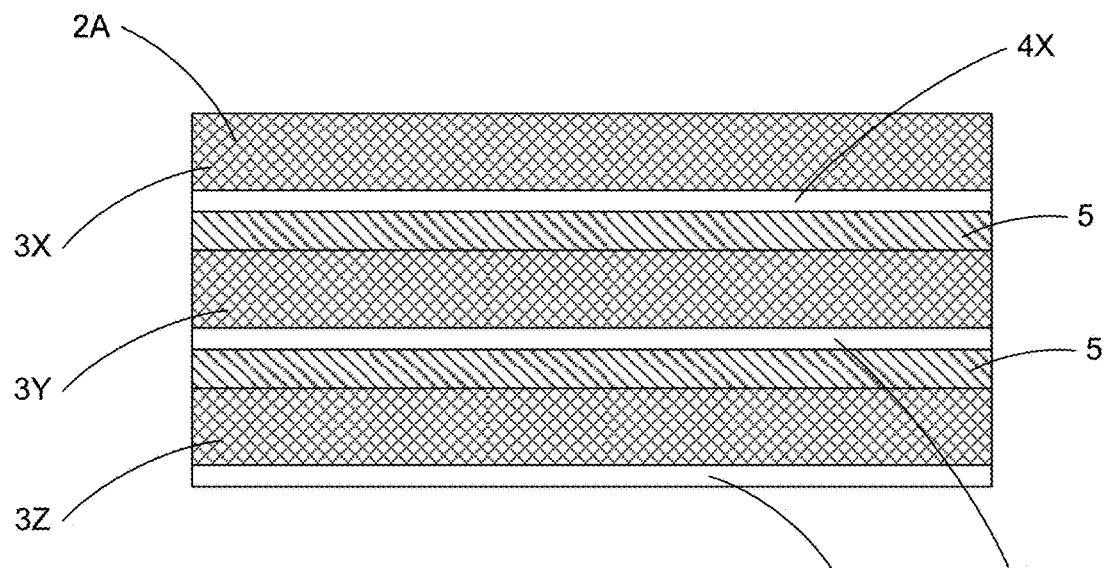

FIG. 2 schematically shows part of a conventional gradient drive coil assembly 2A which may be used as the drive coil assembly of an MRI machine of the type shown in FIG.

Figure 1:
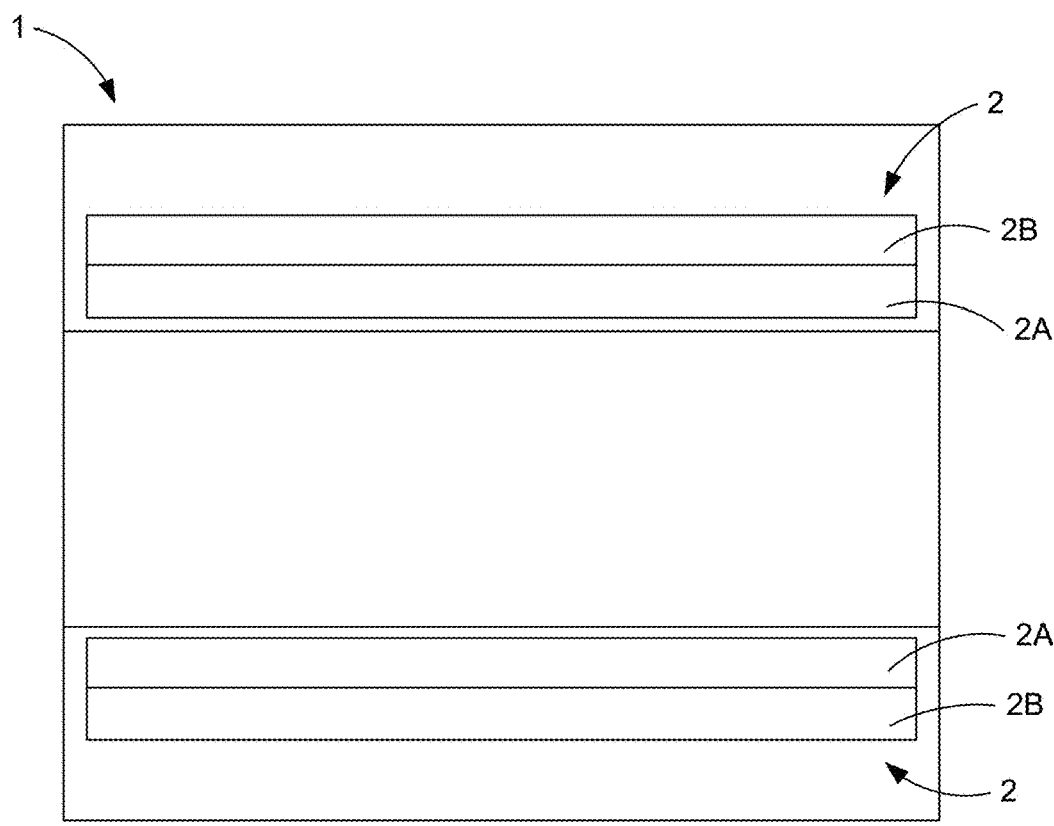
FIG. 1 shows an MRI machine of a generally conventional kind in highly schematic form and with many details omitted for the sake of clarity. The MRI machine 1 shown in FIG. 1 comprises a gradient coil assembly 2 which in the present example comprises an inner set of drive coils 2A and an outer set of shield coils 2B.

1 and which may be supplemented with a similar gradient shield coil assembly 2B to make up the whole gradient coil assembly 2 in the arrangement shown in FIG. 1. However, only the drive coil portion 2A of the gradient coil assembly 2 is shown in FIG. 2.

The conventional gradient drive coil assembly 2A a part of which is shown in FIG. 2, comprises three windings or coil portions 3X, 3Y, 3Z, which act as an X drive coil, a Y drive coil and a Z drive coil when used in the MRI machine 1. These coil portions, 3X, 3Y, 3Z are provided in different layers and other layers are provided between the conductive material of the coil portions themselves, 3X, 3Y, 3Z. In particular, each coil portion 3X, 3Y, 3Z has its own associated B-stage layer 4X, 4Y, 4Z, which is present as a result of the fabrication method used to make up the respective winding/coil portion 3X, 3Y, 3Z. Furthermore, additional insulation layers 5 are provided between the coil portions 3X, 3Y, 3Z. Specifically these are provided between the Z coil winding 3Z and the B-stage material layer 4Y associated with the Y coil winding 3Y and between the Y coil winding 3Y and the B-stage material layer 4X associated with the X coil winding 3X.

The conventional gradient drive coil assembly 2A of which part is shown in FIG. 2 is built up in the following steps with assembly taking place from the bottom upwards:

1. Form the coil turns (3X, 3Y, 3Z) by machining a plate of metal or winding metal into a desired shape.

2. Provide the bottom surface of the coil portion (3X, 3Y, 3Z) with a sheet of B-stage material. This material will help to consolidate the coil mechanically. Typically the coil portion (3X, 3Y, 3Z) and its B-stage backing (4X, 4Y, 4Z) is placed in a heated press to cure the resin B-stage material.

2a. Where the coil turns are formed from a plate of metal, bridging portions may be initially left between at least some adjacent turns in the initial machining process in step 1. This makes the initial coil blank more stable before consolidation. In such a case the bridging portions are removed following step 2.

3. Form the consolidated coil by whatever means chosen to the desired shape.

4. Mount the coil in the gradient coil assembly.

5. Add one or more layers of insulation to maintain an adequate spacing between the layers.

6. Repeat the steps 1 to 5 as often as is necessary to complete the assembly but omitting step 5 for the final coil layer (3X).

Note of course that more layers might be introduced. For example, if a gradient coil assembly including both drive coils and shield coils were to be made then the shield coil layers could be added using a similar technique.

Furthermore, note that in some instances the B-stage material layers 4X, 4Y, 4Z might be replaced by other types of insulating material. For example the coil portions 3X, 3Y, 3Z might be wrapped in an insulating material. As is well understood, as well as providing insulation, B-stage material is useful in consolidating coils. In some cases such consolidation is not required, in other instances a different consolidation layer may be used. Further, sometimes some of the windings in the coil may be consolidated using B-stage material whilst other windings are not.

With a structure of the type described above then the problems discussed in the introduction to description will tend to arise. That is to say, partial discharge is likely to occur in use due to the presence of air bubbles in the B-stage material layers 4X, 4Y. 4Z and/or the presence of burrs, ie sharp edges or points, on the coil portions 3X, 3Y, 3Z.

Thus an alternative structure for a gradient coil assembly 2 is proposed.

Figure 3:
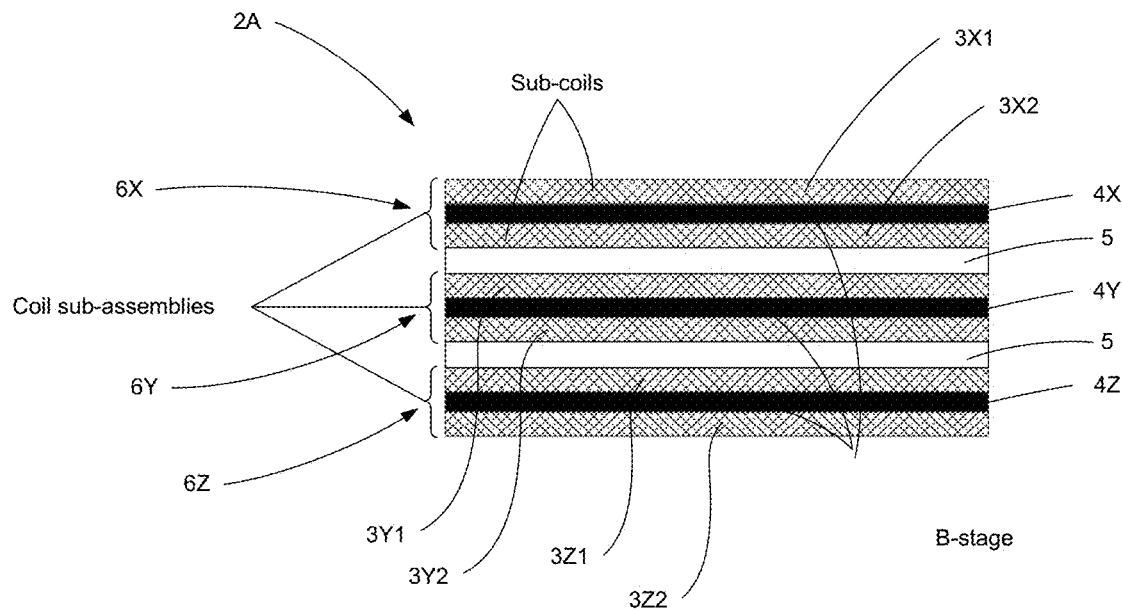

FIG. 3 shows a gradient drive coil assembly 2A which again can be used in an MRI machine 1 of the conventional kind. Again, whilst FIG. 3 shows a gradient drive coil assembly 2A, the structure and techniques described below can equally be used in a gradient shield coil assembly 2B or a gradient coil assembly 2 comprising both drive and shield coils.

In the newly proposed gradient drive coil assembly 2A shown in FIG. 3, there are three gradient coil sub-assemblies 6X, 6Y and 6Z. Each sub-assembly 6X, 6Y, 6Z comprises a respective B-stage material layer for 4X, 4Y, 4Z and also a respective pair of conductive coil portions or windings 3X1, 3X2, 3Y1, 3Y2, 3Z1, 3Z2. Compared with the arrangement described above in relation to FIG. 2, each of the X drive coil. Y drive coil and Z drive coil have been split so that rather than there being a single coil layer including a conductive coil portion, there are two coil layers provided on either side of a respective layer of B-stage material. Thus, the X drive coil sub-assembly 6X comprises one conductive coil portion 3X1 bonded on a first side of a respective sheet of B-stage material 4X and a second conductive coil portion 3X2 bonded on the other side of the sheet of B-stage material 4X.

In the present embodiment, the conductive coil portions are formed from sheet metal by, for example, cutting, milling or punching such that one side of the resultant coil portion has a tendency to have burrs. The coil portions in each sub-assembly 6X, 6Y, 6Z are arranged so that the faces of the coil portions 3X1, 3X2, 3Y1, 3Y2, 3Z1, 3Z2 which will tend to have burrs face in towards the respective B-stage layer 4X, 4Y. 4Z.

In manufacture, each sub-assembly 6X, 6Y, 6Z is first made up and then the sub-assemblies are assembled together with appropriate layers of insulation 5 between each sub-assembly 6X, 6Y. 6Z as shown in FIG. 3 to provide the gradient coil assembly.

In each sub-assembly 6X, 6Y, 6Z the two respective coil portions 3X1 and 3X2, 3Y1 and 3Y2, 3Z1 and 3Z2 are electrically connected to one another so that the pair of coil portions in each sub-assembly act, in effect, as a single winding. In the currently preferred embodiment, the conductive coil portions in each sub-assembly are connected in parallel with one another. That is to say, the first coil portion 3X1 of the X coil sub-assembly 6X is connected in parallel to the second coil portion 3X2 of that sub-assembly whilst the first coil portion 3Y1 of the Y coil sub-assembly 6Y is connected in parallel to the second coil portion 6Y2 of that sub-assembly and so on.

Figure 4:
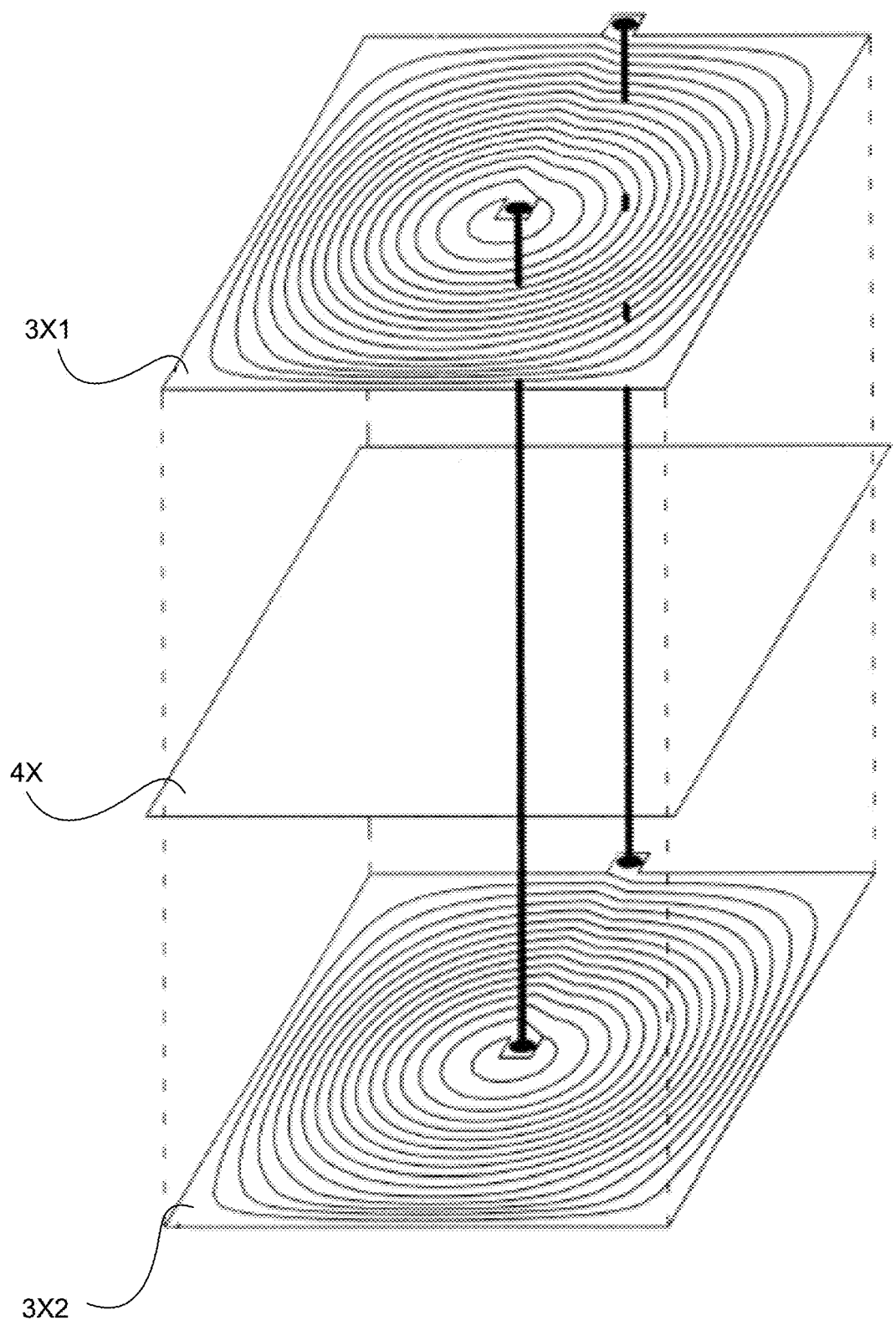
FIG. 4 is an exploded view showing first and second conductive coil portions of one sub-assembly of the gradient coil assembly shown in FIG. 3.

FIG. 4 is an exploded view of the X coil sub-assembly 6X showing an example coil pattern for the first coil portion 3X1 of the X coil sub-assembly 6X and the second coil portion 3X2 of that same sub-assembly 6X. The black dots in the drawing illustrate where these two coil portions are electrically connected to one another with the preferred parallel configuration of the present embodiment. The connections between the layers are also schematically shown. The coil portions 3X1 and 3X2 as shown in FIG. 4 can be connected together electrically via soldering or other suitable means and they will be typically connected to one another at the terminals of the respective sub-assembly or coil (6X in this instance).

In terms of choosing the appropriate parameters for the two coil portions 3X1 and 3X2, 3Y1 and 3Y2, 3Z1 and 3Z2 to replace the equivalent single coil portion 3X, 3Y, 3Z in a coil of the conventional type shown in FIG. 2, then in general terms, a relatively simple approach can be taken. In this the same number of turns and the same average track width is used in the two coil portions (say 3X1 and 3X2) as in the original single portion (say 3X coil) but with each of the two coil portions having half the thickness of the original. Thus, for example, if the original coil component in the conventional type of arrangement shown in FIG. 2 would be sixteen turns of 3 mm thick conductor with an average track width of 10 mm, then in the present embodiment each of the two coil portions, say 3X1, 3X2 would comprise sixteen turns of 1.5 mm thick conductor again with an average track width of 10 mm.

Figure 5:
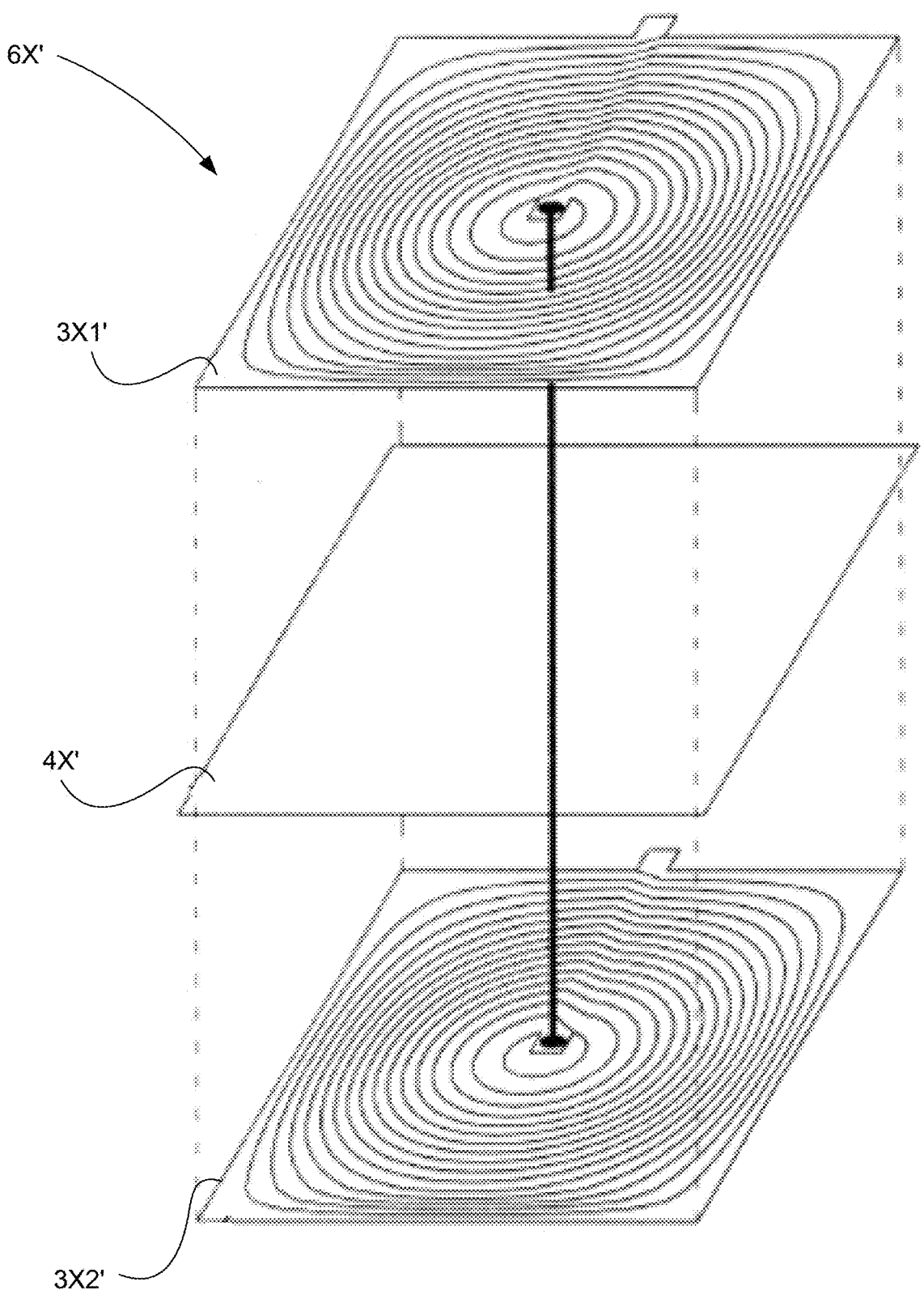
FIG. 5 is an exploded view showing first and second conductive coil portions of an alternative embodiment of gradient coil assembly similar to that shown in FIG. 3.

In an alternative embodiment, rather than using a parallel connection scheme as described above, a series connection scheme can be used such that each respective pair of coil portions 3X1 and 3X2, 3Y1 and 3Y2, 3Z1 and 3Z2 are connected in series relative to one another. FIG. 5 is an exploded view of an alternative X coil sub-assembly 6X° which is like the X coil sub-assembly 6X described above but has the series connection scheme and appropriate coil patterns for such a scheme. An example type of coil pattern for the X coil portions 3X1' and 3X2' in such an alternative are shown in FIG. 5. Here there is a single point of connection between the coil layers illustrated by the dot at the centre of the coil pattern (and schematically shown connector) which connection of course in this arrangement is, at least generally speaking, at a mid-point between the terminals of the sub-assembly/coil as a whole. With this type of implementation, the number of turns per layer is halved and the average track width is doubled in each of the two coil portions compared with what would be used in a conventional single coil. Again, the conductor used is of half the thickness of that which would be used in the corresponding conventional single coil portion. Thus, if in a conventional arrangement as shown in FIG. 2, the coil portion would have sixteen turns of 3 mm thick conductor with an average track width of 10 mm, then in the series configuration of the type illustrated in FIG. 5, each layer would have eight turns of 1.5 mm thick conductor with an average track width of 20 nm.

Note that in FIG. 4 the coil patterns can both be seen from above as in the assembled coil. In this orientation the coil patterns are within practical limits identical to one another. However in terms of their orientations when machined, the coil patterns are, to all intents and purposes, mirror images of one another. This is because the machining process, such as stamping, used in creating the coil patterns will tend to create burrs more on one side of the sheet material than the other. By choosing the coil patterns to be mirror images with one another from the cutting or processing side of the sheet, then once one of the coil portions is inverted so that the two surfaces which are more prone to have burrs on them, face one another, the coil patterns will be to all intents and purposes the same. Thus, in forming the respective coil sub-assembly 6X, 6Y, 6Z, the surfaces of the sheet material including more burrs may be placed in contact with the respective B-stage material consolidation layer.

Note however that if the series connection method is used as described above in relation to FIG. 5, then the coil pattern should preferably be the mirror image of one another when viewed from above as applied to the B-stage material as illustrated in FIG. 5. Thus, when machining sheet metal to produce such coils, the coil patterns should, in practical terms be identical to one another when viewed from the machining side, ie opposite to the situation for the parallel connection system.

With the parallel implementation as described above with reference to FIG. 4, corresponding points of the first and second coil portions, 3X1 and 3X2, 3Y1 and 3Y2, 3Z1 and 3Z2 in each sub-assembly 6X, 6Y, 6Z should be at virtually the same potential at all times when the gradient coil assembly is being used as part of an MRI machine. Thus, the B-stage material used in consolidating each sub-assembly 6X, 6Y, 6Z will be in a region of very low electric field. Thus, in normal circumstances, any bubbles or voids in the B-stage material 4X, 4Y, 4Z should be incapable of generating partial discharge. Furthermore, since the sub-assemblies 6X, 6Y, 6Z are arranged such that any burrs on the conductive coil portions will tend to face inwards against the B-stage material, then the burrs should again be located in a region of low electric field and thus should not become a source of partial discharge.

In the series implementation described above with reference to FIG. 5, similar types of advantages can be obtained although in this instance the potential difference across the B-stage material 4X, 4Y, 4Z between the respective first and second coil portions of each sub-assembly 6X, 6Y, 6Z can at most be the potential difference across the terminals of the sub-assembly. Whilst this potential difference can be larger than that found in the parallel implementation described above with reference to FIG. 4, it is still substantially lower than the type of field strengths that might exist in the conventional arrangement of the type shown in FIG. 2. In that case one is considering the potential difference which may exist between coil portions in different coils. That is to say, in the conventional arrangement of FIG. 2, the B-stage material is located between say the X coil and the Y coil, and therefore the maximum potential difference which may be seen by that B-stage material is dictated by the different potentials which may be applied at any one instant to the X coil and the Y coil.

Whilst in the present embodiments as described above, B-stage material is provided in between the first and second conductive coil portions of each sub-assembly 6X, 6Y, 6Z it should be noted that in some implementations, other types of insulating material might be provided in the sub-assemblies. However the use of consolidating material and in particular a B-stage material is preferred. In such a case the coil sub-assembly 6X. 6Y, 6Z may be manufactured by laminating together the respective coil portions 3X1 and 3X2, 3Y1 and 3Y2, 3Z1 and 3Z2 by placing a piece of B-stage material with the respective coil portions on either side in a press and heating the resulting sandwich in the press.

A typical manufacturing process for producing a sub-assembly 6X, 6Y, 6Z of the type described above is as follows:

1. Construct two gradient coil conductive portions 3X1, 3X2 or 3Y1, 3Y2 or 3Z1, 3Z2 by a cutting, milling or punching process applied to a metal sheet to create two generally spiral electrical windings. Leave a number of bridges between turns to maintain the stability of each coil component. Preferably one of the coil portions is a mirror image of the other as seen from the cutting/processing side, and preferably the locations of the bridges in each portion are chosen so that when the portions are positioned in the sub-assembly, the bridges are not in register with one another. That is to say, the bridges are positioned so that they are different locations in the plane of the sub-assembly.

2. Laminate the two conductive coil portions together by bonding them on either side of a sheet of insulating material 4X, 4Y, 4Z. An epoxy impregnated B-stage material is preferred, in which case bonding may be achieved by heating the three layer sandwich in a press. The conductive coil portions should be orientated such that the sides that have or are prone to burrs are next to the insulating material.

Optionally gaps may left in the insulating material to facilitate the forming of electrical connections between the layers where appropriate.

3. Cut out the metal bridges in a further cutting, milling or punching process. Preferably the bridges are removed from the side of the assembly on which they reside and in a way which creates any burrs close to the centre of the laminated sub-assembly and away from the surfaces of the sub-assembly.

4. Form electrical connections between the two metal layers 3X1 and 3X2, 3Y1 and 3Y2, 3Z1 and 3Z2 by soldering or other means at one end of the winding for series connection and both ends of the windings for parallel connection.

5. The resulting sub-assembly 6X, 6Y, 6Z may now be further processed in a similar manner to conventional consolidated coils. That is to say, the sub-assembly may be formed to shape if desired and built up into a gradient coil assembly in a generally conventional way, which in turn can be incorporated into an MRI machine.

It is worth noting that since the insulating supporting layer, the B-stage material layers 4X, 4Y, 4Z in the embodiments above, is on the midline of the sandwich forming the sub-assembly 6X, 6Y, 6Z, the sub-assembly is less prone to delamination on rolling than is the case for a conventional sub-assembly of a coil portion provided on a piece B-stage material.

Further, since each sub-assembly comprises two relatively thinner metal sheets rather than a single thicker metal sheet, this will tend to permit a narrower cut when forming the coil patterns of the type shown in FIGS. 4 and 5, thus leaving more metal and lowering the coils resistance.

On the other hand a decision may be made to use thicker conductor than in the examples above where the conductor thickness is half compared with that which would be conventionally used. In such a case, the present techniques can help in the construction and handling of thicker/heavier gauge assemblies.

It will be appreciated that the order in which the X, Y and Z coils are provided in layers in the above embodiments is not critical. The X, Y and Z coils may be arranged in any convenient order when carrying out the current techniques.

It will be appreciated that in overall terms the present technique can be embodied in a method for making a coil to replace an existing saddle coil design with the steps of: using the pattern (in the plane of the coil) of the existing saddle coil design, punching that pattern out twice (once in mirror image for the parallel connection arrangement) from material having half the thickness of the existing saddle coil design to form two punched coils, bonding the resulting two punched coils on opposite sides of an insulating substrate with the burrs innermost and connecting (by for example soldering) the coils together. In the case of the parallel connection arrangement the start tabs and end tabs of the two coils may be respectively connected to one another.

The invention claimed is:

1. A method of manufacturing a gradient coil sub-assembly, comprising:
   a) laminating a first punched sheet metal conductive saddle coil portion and a second punched sheet metal conductive saddle coil portion together by bonding the first and second punched sheet metal conductive saddle coil portions on opposing sides of a B-stage material insulation layer; and
   b) electrically connecting the first punched sheet metal conductive saddle coil portion to the second punched sheet metal conductive saddle coil portion in parallel so that the first and second conductive saddle coil portions act together as one saddle coil,
   wherein, the gradient coil sub-assembly comprises:
   a first coil layer comprising the first punched sheet metal conductive saddle coil portion which has a higher incidence of burrs, left by a respective punching process, on one face than an opposing face of the first coil layer,
   a second coil layer comprising the second punched sheet metal conductive saddle coil portion which has a higher incidence of burrs, left by a respective punching process, on one face than an opposing face of the second coil layer,
   the B-stage material insulation layer is sandwiched between the first and second coil layers, with the first punched sheet metal conductive saddle coil portion bonded to a first side of the B-stage material insulation layer and the second punched sheet metal conductive saddle coil portion bonded to a second, opposite, side of the B-stage material insulation layer and the one face of each of the first and second punched sheet metal conductive saddle coil portions having the higher incidence of burrs are facing and bonded to the B-stage material insulation layer, such that the B-stage material insulation layer and burrs are located in a region of minimized electric field strength when the the gradient coil sub-assembly is used in an MRI machine helping minimize partial discharge.

2. A method according to claim 1 comprising before step a) a further step of processing a metal sheet to form the first punched sheet metal conductive saddle coil portion and the second punched sheet metal conductive saddle coil portion with desired coil patterns.

3. A method according to claim 2 comprising a step of initially leaving a plurality of bridges between turns in the desired coil patterns to provide support during manufacture and removing the bridges after step a).

4. A method according to claim 3 in which the bridges left initially in the first and second punched sheet metal conductive saddle coil portions are not in register with one another.

5. A method according to claim 3 in which the bridges are removed from a respective side of the gradient coil sub-assembly and removed in a way so that any burrs that are created will tend to be created on or towards the one face of each of the first and second coil layers facing the B-stage material insulation layer.

6. A method according to claim 2 comprising a further step of performing the process on the metal sheet by forming a pattern from one side of the metal sheet and choosing the coil pattern of the first punched sheet metal conductive saddle coil portion to be a mirror image of the coil pattern of the second punched sheet metal conductive saddle coil portion when both of the first and second punched sheet metal conductive saddle coil portions are viewed from the one side of the sheet metal from which the process is performed.

* * * * *